(12) United States Patent
Furnival

(10) Patent No.: US 8,094,458 B2
(45) Date of Patent: Jan. 10, 2012

(54) SEMICONDUCTOR PACKAGE WITH EMBEDDED MAGNETIC COMPONENT AND METHOD OF MANUFACTURE

(75) Inventor: Courtney R. Furnival, Lake Arrowhead, CA (US)

(73) Assignee: Microsemi Corporation, Aliso Viejo, CA (US)

( * ) Notice: Subject to any disclaimer, the term of this patent is extended or adjusted under 35 U.S.C. 154(b) by 404 days.

(21) Appl. No.: 12/383,468

(22) Filed: Mar. 23, 2009

(65) Prior Publication Data

US 2009/0237899 A1    Sep. 24, 2009

Related U.S. Application Data

(60) Provisional application No. 61/039,042, filed on Mar. 24, 2008.

(51) Int. Cl.
*H05K 1/18* (2006.01)
*H01F 5/00* (2006.01)

(52) U.S. Cl. ............ 361/761; 29/832; 29/846; 174/260; 257/678; 257/723; 336/200; 336/232

(58) Field of Classification Search .......... 361/760–762; 29/825, 829, 832, 841, 846; 174/250, 260; 257/678, 723; 336/200, 232
See application file for complete search history.

(56) References Cited

U.S. PATENT DOCUMENTS

| | | | |
|---|---|---|---|
| 5,469,334 A * | 11/1995 | Balakrishnan | 361/782 |
| 7,256,676 B2 * | 8/2007 | Poynton | 336/200 |
| 7,277,002 B2 | 10/2007 | Harding | |
| 7,307,341 B2 | 12/2007 | Humbert et al. | |

FOREIGN PATENT DOCUMENTS

WO     WO 03-081614 A1     10/2003

OTHER PUBLICATIONS

International Application No. PCT/US2009/037975, International Search Report dated Nov. 3, 2009, 3 pages.

* cited by examiner

*Primary Examiner* — Robert J Hoffberg
(74) *Attorney, Agent, or Firm* — Holland & Hart LLP

(57) ABSTRACT

A printed circuit board (PCB) substrate which can be used in a semiconductor package, such as BGA and LGA, has a top surface and a bottom surface. A magnetic component includes a laterally extending bottom plate, two or more vertically extending posts, and a laterally extending top plate, wherein the bottom plate is fully embedded within the PCB substrate and the two or more posts extend in the PCB substrate from the bottom plate toward the upper surface of the PCB substrate. The top plate contacts an end of each of the two or more posts along the top surface of the PCB substrate.

45 Claims, 5 Drawing Sheets

SEMICONDUCTOR PACKAGE WITH EMBEDDED MAGNETIC COMPONENT AND METHOD OF MANUFACTURE

CROSS-REFERENCES TO RELATED APPLICATIONS

This application claims the benefit of U.S. Provisional Application No. 61/039,042, filed Mar. 24, 2008, which is incorporated herein by reference in its entirety for all purposes.

BACKGROUND OF THE INVENTION

Many electronic products, including such power products as DC-DC Converters, Off-Line Converters, Power Supplies and Magnetically Isolated Gate Drives, include semiconductor devices, passive components and magnetic components in their circuitry. These and other similar products are typically large and built on printed circuit boards (PCBs). PCBs can easily accommodate large power devices and magnetic components. Miniaturization and integration of the semiconductor devices is an on-going trend in the industry, but the size and mechanical complexity of magnetic components (transformers and inductors) have limited the full integration of devices containing such magnetic components into standard semiconductor packages.

It is advantageous to reduce the component size and complexity in such products so that they can be integrated into standard semiconductor packages. Such packages are smaller, providing higher circuit density and improved power performance. Furthermore, such standard packages are typically tooled and automated at off-shore contract assemblers, which allows for lower manufacturing costs and little to no assembly equipment and tooling non-recurring expenses.

Thus, there is a need for simple and cost effective techniques for integrating magnetic components with active and/or passive components in a semiconductor package.

BRIEF SUMMARY OF THE INVENTION

In accordance with an embodiment of the invention, a printed circuit board (PCB) substrate has a top surface and a bottom surface. A magnetic component includes a laterally extending bottom plate, two or more vertically extending posts, and a laterally extending top plate, wherein the bottom plate is fully embedded within the PCB substrate and the two or more posts extend in the PCB substrate from the bottom plate toward the upper surface of the PCB substrate. The top plate contacts an end of each of the two or more posts along the top surface of the PCB substrate.

In one embodiment, the top plate extends over the top surface of the PCB substrate. In another embodiment, the PCB substrate has a cavity along its top surface, and the top plate is disposed in the cavity such that a top surface of the top plate is substantially coplanar with or recessed relative to the top surface of the PCB substrate.

In another embodiment, the magnetic component includes one of a U-core and an E-core.

In another embodiment, the structure further includes at least one set of windings encircling at least one of the two or more posts. In another variation, the structure includes primary and secondary windings encircling at least one of the two or more posts. In still another variation, the primary and secondary windings encircle the bottom plate.

In another embodiment, the structure further includes a thermally conductive pre-preg along the walls of each of the two or more posts. In one variation, the structure includes a soft pre-preg along the walls of each of the two or more posts. In another variation, the structure includes a high flow pre-preg along the walls of each of the two or more posts.

In another embodiment, the structure further includes a soft encapsulating material, such as a soft coating material, encapsulating the top plate and extending along the walls of each of the two or more posts.

In another embodiment, the structure further includes one or more IC die electrically attached to the top surface of the PCB substrate.

In another embodiment, the structure is a semiconductor package which incorporates the PCB substrate. In one variation, the semiconductor package is one of a ball grid array (BGA) package and a land grid array (LGA) package. In another variation, the semiconductor package includes a top-side encapsulating layer encapsulating the top surface of the PCB substrate, and at least two pad areas along a bottom side of the package where external electrical connection can be made to the package. In yet another variation, the semiconductor package includes one or more IC die electrically coupled to the top surface of the PCB substrate, a top-side encapsulating layer extending over the entire top surface of the PCB substrate and encapsulating all exposed portions of the magnetic component and the one or more IC die, and conductive pads along the bottom surface of the PCB substrate. In still another embodiment, the top-side encapsulating layer comprises one of a molding compound and a potting compound.

In another embodiment, the magnetic component is positioned diagonally on the top surface of the PCB substrate to obtain higher packing density.

In another embodiment, the top and bottom plates and the two or more posts form parts of one of an inductor and a transformer.

In accordance with another embodiment, a PCB substrate-based package includes a PCB substrate having a top surface and a bottom surface, and the PCB substrate includes a plurality of PCB layers with conductive traces extending through each PCB layer. A magnetic post is fully embedded within the PCB substrate, and the magnetic post extends perpendicular to the top and bottom surfaces. In one embodiment, the PCB substrate-based package further includes primary and second windings encircling the magnetic post, and the primary and secondary windings are formed of a select group of the conductive traces and a predetermined number of via for contacting conductive traces of adjacent PCB layers. In another embodiment, the PCB substrate-based package further includes a set of windings encircling the magnetic post, and the set of windings is formed of a select group of the conductive traces and a predetermined number of via for contacting conductive traces of adjacent PCB layers.

In accordance with another embodiment of the invention, a method for embedding a magnetic component in a PCB substrate for a semiconductor package includes the following steps. An upper part and a lower part of a PCB substrate are provided, and the upper part includes a plurality of upper PCB layers, and the lower part includes at least one lower PCB layer. Two or more holes are formed in the upper PCB layers. Posts of the magnetic component are inserted in the two or more holes with a bottom plate of the magnetic component remaining exposed along a first surface of the upper PCB layers. The at least one lower PCB layer is placed over the first surface of the upper PCB layers and over the bottom plate of the magnetic component so that the bottom plate is encased by the upper and lower PCB layer.

In one embodiment, a magnetic top plate is placed along a second surface of the upper PCB layers opposite the first surface such that the magnetic top plate is in contact with an end of each of the posts of the magnetic component. In one variation, the top plate extends over the second surface of the PCB substrate. In another variation, the magnetic top plate is placed in a cavity formed along the second surface such that a surface of the magnetic top plate is substantially coplanar with or recessed relative to the second surface of the upper PCB layers.

In one embodiment, prior to placing the at least one lower PCB layer over the first surface, a layer of thermal pre-preg is placed over the first surface and over the bottom plate, and a lamination process is performed to soften the thermal pre-preg so that the thermal pre preg flows into the two or more holes of the upper PCB layers along the walls of the posts of the magnetic component. In one variation, prior to placing the at least one lower PCB layer over the first surface, a layer of thermal pre-preg having a slot in the shape of the bottom plate is placed over the first surface.

In another embodiment, prior to placing the at least one lower PCB layer over the first surface, a spacer board having a slot in the shape of the bottom plate is placed over the first surface.

In another embodiment, the method further includes placing one or more IC die on the second surface of the upper layers, and forming an encapsulating layer over the second surface of the upper layers to encapsulate the magnetic top plate and the one or more IC die.

In another embodiment, the method further includes attaching electronic components to the PCB substrate using one of chip-and-wire assembly process and surface-mount assembly process.

In another embodiment, after placing the magnetic top plate along the second surface, a soft encapsulating material, such as a soft coating material, is dispensed around the posts.

In accordance with yet another embodiment of the invention, a method for embedding a first magnetic plate in a PCB substrate includes the following steps. An upper part and a lower part of a PCB substrate are provided. The upper part includes a plurality of upper PCB layers, and the lower part includes at least one lower PCB layer. The first magnetic plate is placed over a first surface of the upper PCB layers, and the at least one lower PCB layer is placed over the first surface of the upper PCB layers and over the first magnetic plate so that the first magnetic plate is encased by the upper PCB layers and the at least one lower PCB layer.

In one embodiment, the method further includes forming two or more holes in the upper PCB layers. Magnetic posts of a magnetic component are then inserted in the two or more holes such that an end of each of the magnetic posts is in contact with the first magnetic plate. The magnetic component includes a plate portion that remains at least partially exposed after the magnetic posts are inserted.

In another embodiment, the upper PCB layers includes a cavity along a second surface of the upper PCB layers opposite the first surface, and the cavity receives the plate portion of the magnetic component during the inserting step. The cavity has sufficient depth such that a surface of the plate portion of the magnetic component is substantially coplanar with or recessed relative to the second surface of the upper PCB layers.

In another embodiment, after inserting the posts, a soft coating material is dispensed around the posts.

In another embodiment, prior to placing the at least one lower PCB layer over the first surface, a layer of thermal pre-preg having a slot in the shape of the first magnetic plate is placed over the first surface In another embodiment, prior to placing the at least one lower PCB layer over the first surface, a spacer board having a slot in the shape of the first magnetic plate is placed over the first surface.

The following detailed description and the accompanying drawings provide a better understanding of the nature and advantages of the present invention.

DETAILED DESCRIPTION OF THE INVENTION

In accordance with embodiments of the invention, integration of magnetic components with various passive and/or active components in a PCB substrate-based package is made possible using various techniques including: (1) design and manufacturing of PCB substrates which enable embedding planar and/or vertical magnetic components into the PCB substrate, (2) embedding techniques with standard and thermal pre-pregs and copper which provide lower thermal resistance to both the magnetic components and semiconductor circuitries, and (3) package structures which provide for high voltage isolation for isolated devices such as DC-DC converters. Package and magnetic construction techniques for implementing items (1)-(3) are described. In one embodiment, the package and magnetic construction techniques are based on three technologies: (1) embedded magnetic components, (2) Soft, high Flow, Thermal (SFT) pre-Preg, and (3) molded PCB substrate-based packages with ball grid array (BGA) or land grid array (LGA) type architecture.

The term "package" as used herein refers to packages that include a single electronic component such as a IC die, or multiple electronic components, such as multiple die. As such the term "package" is intended to cover what are commonly known as semiconductor modules which include multiple discrete electronic components.

Figure 1A:
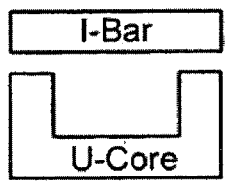
FIGS. 1A and 1B respectively show cross section views of a U-core and an E-core.
Figure 1B:
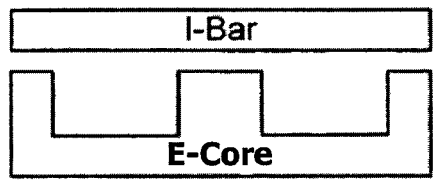

I. Magnetics:

In some embodiment, transformers and inductors may be constructed based on the planar or vertical winding architectures. Employing a standard PCB, the windings may be formed using the PCB copper conductor layers and copper via between the conductor layers. The cores of magnetic components may be inserted through holes in select layers of the PCB during the PCB fabrication process. In one embodiment, the cores have two parts that are brought in contact during manufacturing. One part has a bottom plate (also referred to herein as cross-bar) and posts extending vertically from the bottom plate and projecting through the PCB, and the other part is a top plate (also referred to herein as I-bar) glued in place on the PCB to complete the magnetic loop(s). In an alternate embodiment, the cores have more that two parts (top plate, bottom plate and multiple posts) that are brought in contact with one another during manufacturing. The term "plate" as used herein in connection with the core refers to a horizontally extending portion of the core, as opposed to a "post" which refers to a vertically extending portion of the core. The most common core configurations are the U-core and E-core shown in FIGS. 1a and 1b, respectively. However, the present invention is not limited to U-core or E-core configurations, and may be implemented using other core configurations.

Figure 2A:
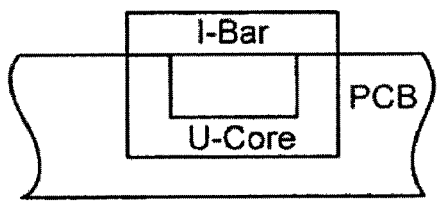
FIGS. 2A and 2B respectively show a U-core and an E-core embedded in a PCB in accordance with embodiments of the invention.
Figure 2B:
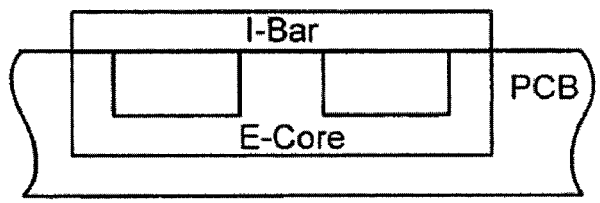

In one embodiment, the bottom plate and the vertical posts of the core are embedded into the PCB substrate during the lamination process. The core is then completed by gluing the top plate on the top side of the PCB. Examples of the embedded magnetic components are shown for the common U-core and E-core configurations in FIGS. 2a and 2b, respectively. Other more complex core configurations are also possible, and methods for embedding them in the PCB would be obvious to one skilled in this art in view of this disclosure.

Figure 3:
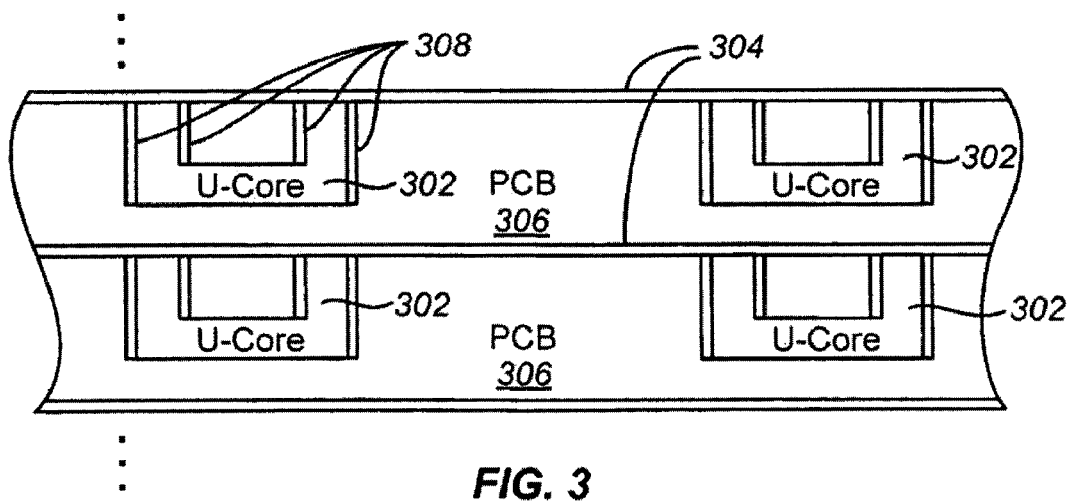
FIG. 3 depicts a stack of multiple PCB panels with U-cores embedded in each panel in accordance with another embodiment of the invention.

FIG. 3 depicts a portion of a stack of multiple PCB panels with U-cores embedded in each panel in accordance with an embodiment of the invention. Cores 302 are inserted into select layers of the PCB panel stack-up prior to final lamination operations using conventional pick and place (P&P) equipment. Paper separators 304 are used between panels of PCB 306 to prevent the pre-preg material from flowing onto the top of the core posts. Pre-preg 308 flows during the lamination process and fills the space between cores 302 and the walls of PCB holes or grooves, as shown in FIG. 3.

The selection of the final or glue pre-preg is important for mechanical and thermal properties as would be the selection of core encapsulating material (e.g., the potting material) if filling the space between the cores and the walls of the PCB holes is left until after the PCB fabrication (i.e., is carried out during the assembly operation). There are a number of important factors in selecting the optimum pre-preg including: (1) good flow properties to fill the space between the core posts and PCB hole walls (this consideration also applies to selection of the core encapsulating material if filling the space between the core posts and the walls of PCB holes is left until after the PCB fabrication), and to allow the bottom plate of the core to be completely embedded in the pre-preg material, (2) good mechanical strength to hold the core in place, (3) low durometer cured state to allow stress relieve CTE mismatch between the PCB and the core during temperature excursions (such stresses can cause cracking and/or magnetostriction in the cores), and (4) thermally conductive pre-preg to enhance heat transfer from the core to the PCB and eventually to the external pads of the package.

Figure 4A:
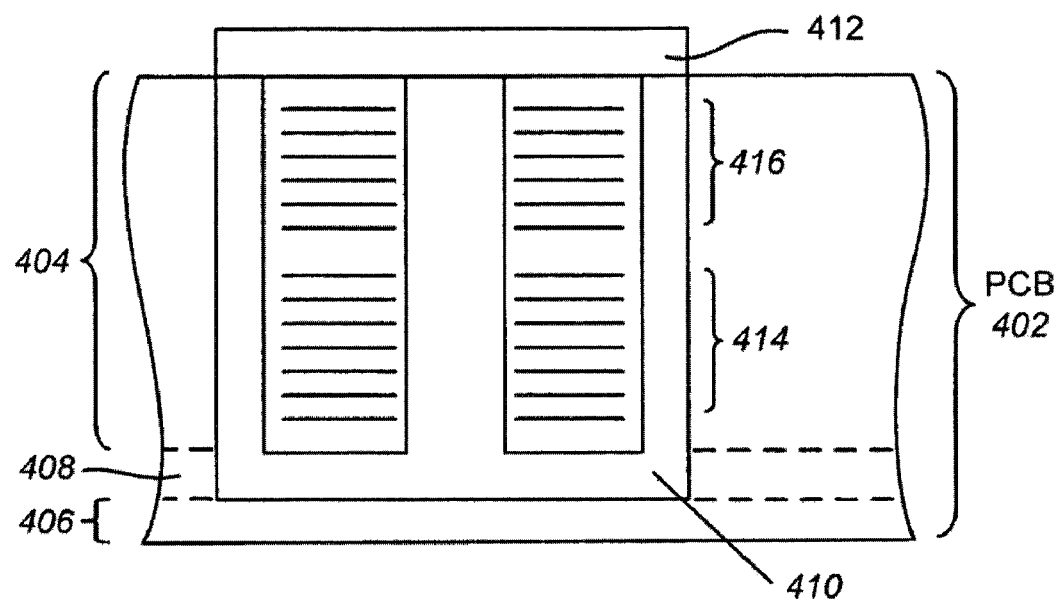
FIGS. 4A and 4B respectively show cross section views of a planar transformer with an embedded E-core and a vertical transformer with an embedded U-core, according to another embodiments of the invention.
Figure 4B:
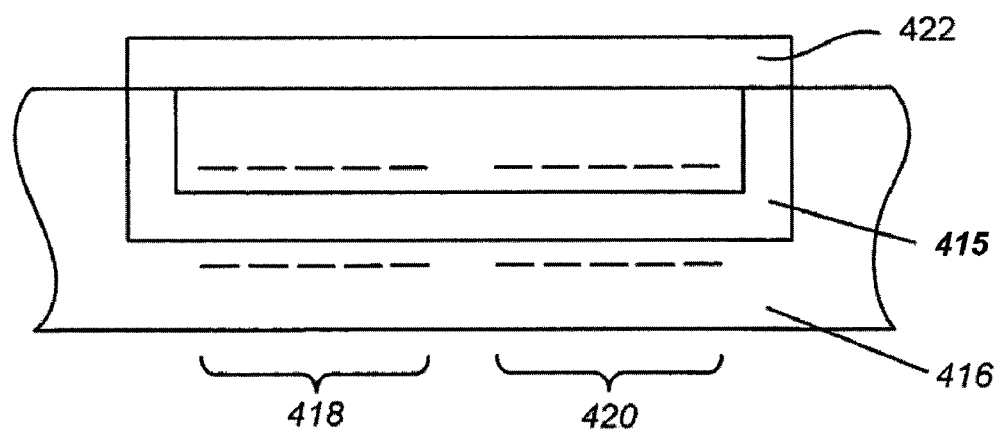

The traces on PCB conductor layers serve as the transformer windings (with via to provide the interconnections between turns of multilayer windings) and the connections between all components and external pads. The windings can be standard planar windings, but the embedded cores allow for vertical windings as well. FIG. 4A illustrates an E-core transformer with planar windings, and FIG. 4B illustrates a U-core transformer with vertical windings, according to embodiments of the invention. In FIG. 4A, PCB 402 includes upper PCB layers 404 and lower PCB layers 406 with thermal pre-preg 408 separating them from one another. Posts of E-Core 410 extend through holes made in upper PCB layers 404 and contact I-bar 412 along the top surface of PCB 402. Primary winding layers 414 and secondary winding layers 416 are formed in upper PCB layers 404. In FIG. 4B, U-core 415 is embedded in PCB 416 with primary and secondary winding layers 418, 420 formed around the horizontally extending portion of U-Core 414. I-bar 422 extends over PCB 416 and contacts ends of the U-core posts.

II. Package:

In one embodiment, the package with embedded magnetics is a PCB substrate-based package that is built using such package technology as the Ball Grid Array (BGA) technology and Land Grid Array (LGA) technology. The primary feature of the BGA or LGA package is an array of substrates formed with a PCB, which is over-molded after assembly. The external connections are made through pads or pads and balls on the bottom side of the exposed package substrate. The molded substrate arrays are sawed into individual packages at the end of the assembly process.

A portion of the magnetic cores are embedded into the substrate array or PCB panel during the PCB fabrication process. The panel is split into assembly size strips containing arrays of BGA substrates, and assembly is performed on the top side of these multi-unit strips. The strips are suitable for active and passive component assembly, and most standard semiconductor assembly techniques are compatible including chip and wire assembly for active components, and SMD (solder and epoxy) assembly for both active and passive components. Assembly is completed by over-molding the top-side of the array, placing solder or solder and balls on the bottom side, and sawing the arrays into individual packages or devices. The BGA or LGA assembly processes, tooling and equipment are relatively standard, and will not be discussed further herein.

The embedded planar magnetic structure will be described in detail next, but the vertical magnetic structures are similar. As depicted in FIGS. 4A and 4B, the vertical structure differs in winding and via configuration and also requires conductor layers beneath the embedded core.

III. PCB with Embedded Core and Windings:

In one embodiment, PCB panels are fabricated in groups or stacks of PCB layers and laminated together. The PCB fabrication with embedded core and windings described herein uses the E-core as an example, but the techniques are applicable to embodiments with U-cores or other core geometries.

Figure 5A:
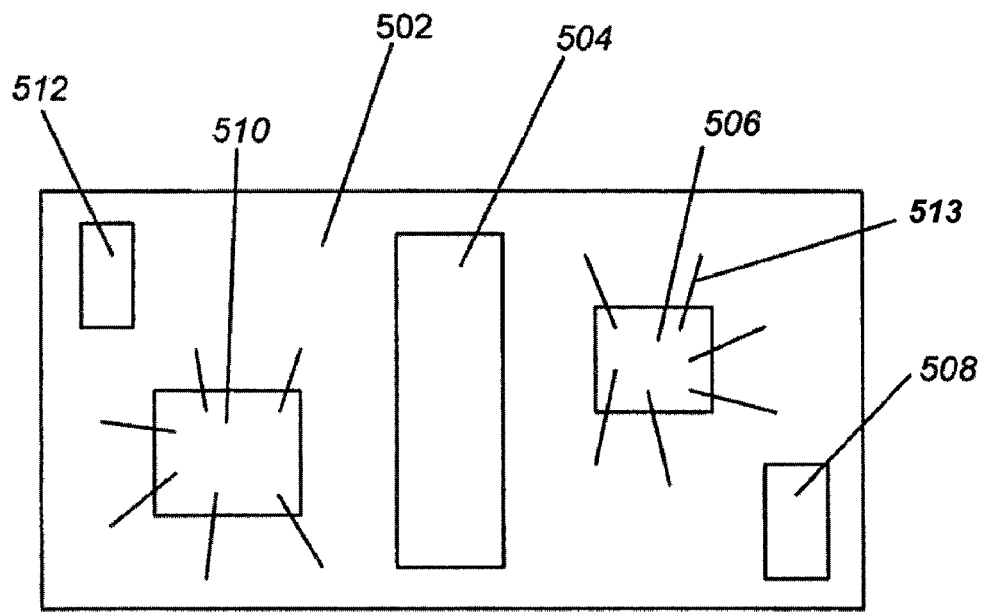
FIGS. 5A-5B respectively show top and side views of a package device with an embedded E-core and other components according to another embodiment of the invention.
Figure 5B:
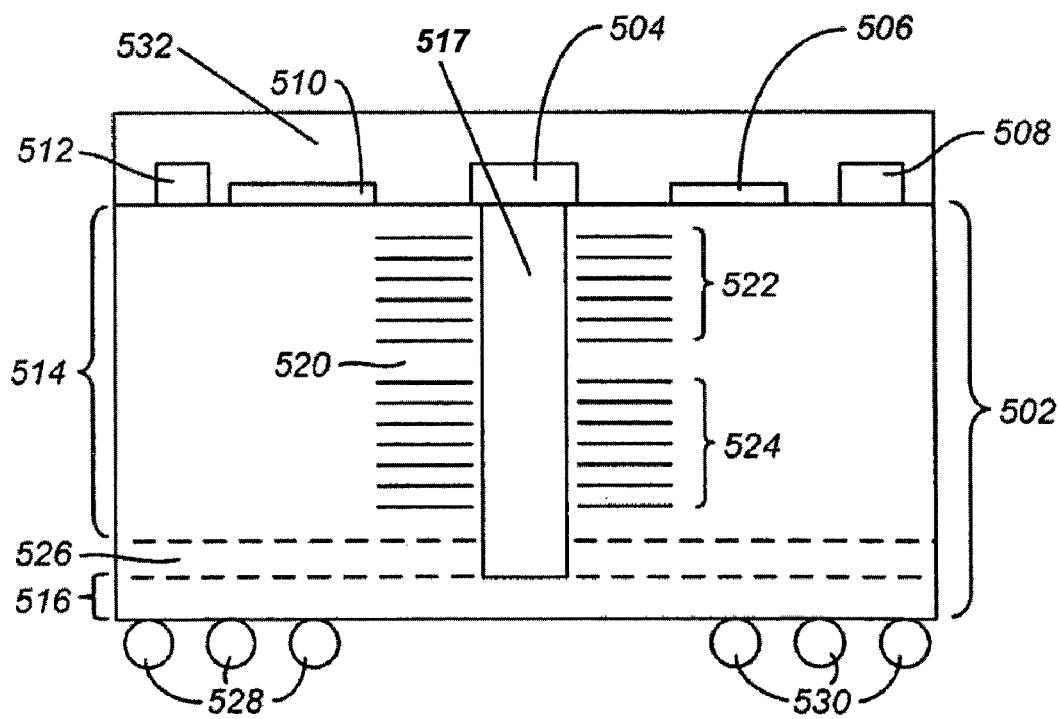

The PCB panel is processed initially as upper PCB layers and lower PCB layer(s). In some embodiments, the planar magnetic PCBs contain all winding layers, traces and top-side pads in the upper PCB layers (with the core embedded in the upper layer), and the solder and/or ball pads on the bottom-side of the lower PCB layer(s). Two such embodiments are shown in FIGS. 4A and 5B where the upper and lower PCB layers are clearly delineated. Vertical magnetic PCBs have a portion of each turn in the bottom PCB layer(s). In both planar and vertical magnetic PCBs, via are used to connect the windings and traces, but the via are not shown in the examples and figures.

The upper PCB layers for planar magnetic PCBs can include multiple double-sided-layers (DSLs) for pairs of layers for both primary and secondary turns. The top PCB DSL includes component pads and other interconnect traces. The primary PCB DSLs (corresponding to the transformer primary windings) are laminated and interconnect via are plated, and the same is done for the secondary layers (corresponding to the transformer secondary windings). The primary and secondary layers are laminated together, and the pre-preg separating the primary layers from the secondary layers will generally be thicker for isolated products. Such thicker separating pre-preg is marked with reference numeral 520 in the exemplary embodiment shown in FIG. 5B. This sequence can change with interleaving or special interconnects, but the same process and techniques are applicable. Holes are then made in the upper layers for the magnetic core posts. Round holes are generally drilled and square or rectangular holes are generally routed or punched. The lower PCB layers are generally a single layer for planar magnetics with bottom-side solder pads or ball pads, but may include DSL(s) for vertical magnetics or for other electrical interconnections.

Once the upper and lower PCB layers are completed, they are inverted and the cores are inserted into the upper layers with the exposed cross-bars extending over the upper layers and the posts extending into the holes of the panel for each core. The cores can be embedded in a number of different ways. In one embodiment, a layer of thick high flow thermal pre-preg is placed on top of the inverted upper PCB layers and over the inserted core for each panel, and then the inverted lower layers is placed on the stack. If the core cross-bar is very thick, it will be necessary to use a thicker thermal pre-preg layer. In another embodiment, slots are punch-out in the thermal pre-preg to accept the core cross-bars. In yet another embodiment, a spacer board is used before the thermal pre-preg is added. First slots are punched in a cured pre-preg board to accommodate the exposed cross-bar. The boards are then placed over the cores after they have been inserted, and before the thermal pre-preg layer is added. The board creates a cavity during lamination to protect the cores from excessive lamination pressure, and also acts as a spacer to control the thickness of the embedding materials during lamination.

Multiple panels are stacked up and then placed in the vacuum laminating press, separated by lamination separator paper that keep panels from sticking together and prevent pre-preg from squeezing onto the exposed post ends. The lamination heating profile must be designed to soften the thermal pre-preg to allow the core cross-bars to embed into the thermal pre-preg slowly. Once embedded, the press pressure can be increased to complete flow while the press temperature is raised to the full curing temperatures. The lamination will potentially require different processes and development for both placement and lamination variations for different product structures. This can include some modifications to the standard pick-and-place equipment to extend the reach over the larger 24"×18" standard panels.

Once the upper and lower layers are laminated together, the via can be drilled and plated to make all the necessary remaining connections between the upper and lower layers. There may also be other conventional PCB operations like etching, cleaning, resist and others. The particulars of these operations may vary depending on specific product and processes.

The PCB panels are then sawed into multiple device arrays or strips for component and package assembly. The strips may not be sawed into individual units until after complete assembly, and sometimes after assembly and test.

While in the above process, the E-core is embedded in the PCB substrate first and then the I-bar is attached to the E-core, the reverse order can be carried out as well. That is, the I-bar may first be embedded in the PCB substrate and then the E-core is inserted in PCB holes to contact the embedded I-bar. In yet another embodiment, the posts of the E-core and its cross-bar are separate pieces, and the cross-bar, the posts, and the I-bar are attached to the PCB substrate in three separate steps (e.g., either the cross-bar or the I-bar is embedded first, the cores are inserted next, and then the other one of the cross-bar and the I-bar is attached).

IV. Package Assembly:

The multiple device strips may be designed to accommodate standard tooled block molds and other BGA assembly equipment and tooling. Strips are typically about 2"×6" for three (3) 2"×2" block molds, and each block contains multiple packages or devices. The strips may then be assembled using standard assembly techniques. The most common assembly technique for this type of package is epoxy die attach and wire bonding, but other attachment techniques and materials may be used. Semiconductor die and passive components are generally attached with solder and a conductive epoxy (e.g., silver or gold or other epoxy material) to make mechanical, thermal and electrical connections.

The I-bar or top plate is glued flush to the top surface of the substrate and over the embedded core posts or directly to the ends of the core posts with a non-conductive epoxy or adhesive. In general, the glue is thin to provide intimate contact between the embedded and the top side core components. In special cases were gaps or other special configurations are required, there may be deliberate separation.

After all the top-side components are attached, any semiconductor die are generally wire bonded with gold thermosonic or aluminum ultrasonic wire bonds, although this technique is applicable to other assembly operations and sequences such as solder-bump flip-chips. FIG. 5A provides a top view example of a BGA device with embedded E-core without the over-mold. FIG. 5B provides an example of a cross-section view of a BGA package with embedded E-core and over-mold. In the FIG. 5A top view, I-bar 504 separates output components such output IC 506 and output capacitor 508 from input components such as input IC 510 and input capacitor 512. Lines 513 extending out of input and output IC's 506, 510 represent bond wires. In the FIG. 5B cross-section view, upper layers 514 and lower layers 516 of PCB 502 are separated from each other by thermal pre-preg 526. As mentioned earlier, a spacer board with one or more slots in the shape of the bottom plate(s) of the E-core(s) may be used in place of pre-preg 526. An end view of E-core 517 can be seen with I-bar 504 making contact with the top end of the E-core posts. Primary windings 522 and secondary windings 524 are formed in upper PCB layers 514 and are separated from each other by pre-preg 520. FIG. 5B also shows input components 510, 512 and output components 506, 508 being attached along the top side of PCB 502.

Returning to the package assembly process, the package is then completed by forming an encapsulating layer 532 on the top-side of the PCB strip to provide mechanical and environmental protection to the top-side components, wires and traces. Encapsulating material 532 may include a molding material or a potting material, or a combination of the two, and may be used to not only encapsulate I-bar 504 but to also fill in the space between posts 518 and the walls of the PCB holes. Where the encapsulating material is used to fill the spacing between posts 518 and the walls of the PCB holes, openings are provided along the top surface for dispensing soft coating material around posts 518. Use of soft coating material to fill the spacing between posts 518 and the walls of the PCB holes advantageously minimizes stress in magnetic cores. Thus, the encapsulating material can be soft for magnetic cores or hard for semiconductor die, or any combination required for optimum thermal and mechanical performance and reliability. Solder or solder and solder balls 528, 530 are then placed on the bottom side of the blocks. The multiple device blocks are then sawed into individual components, to complete the assembly process.

The assembly usually includes other operations not described herein, because they are well known and product specific. They include operations like marking, reflow, testing and other special operations.

Thus, the embedding techniques in accordance with the invention enable maximizing the size of the magnetic core while providing space for other components and providing isolation between the input and output portion of the circuit all in a relatively small package. The smaller package and the simple embedding process reduce costs, increase reliability and provide end customers with higher circuit density.

Figure 6A:
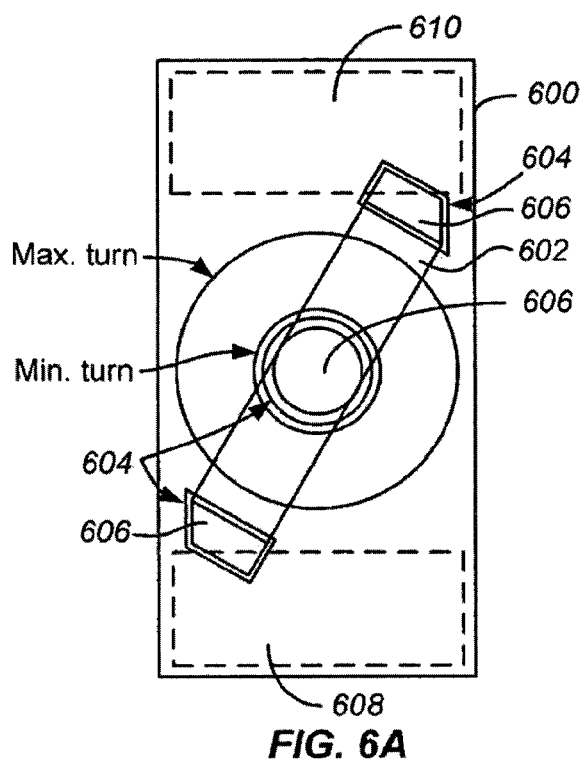
FIGS. 6A-6F show various views of a package device as well as various views of an E-core embedded in the package in a diagonal fashion according to yet another embodiment of the invention.

Further advantages were obtained by placing the E-core on a diagonal of the package, as shown in FIG. 6A. This allows for a longer E-core 602 (e.g., as compare to the core configuration shown in FIG. 5A) without splitting the input circuit area and without splitting the output circuit area. It also keeps the input and output circuitry on opposite ends of the package, increasing the external input to output creepage path, which allows high (up to 3750V in one embodiment) input/output isolation. It also allows easy and direct access for primary and secondary windings on opposite sides of the core. FIGS. 6A-6F show various aspects of this embodiment.

Note, the core is longer than the package width, yet the free space is split into two usable spaces at the package ends, which maximizes the component space and keeps all the input and output circuitry together on opposite ends of the package. This further allows the external bottom side pads to be separated by the spacing (e.g., 8 mm) required as minimum creepage by safety agencies like UL and VDE.

Figure 6C:
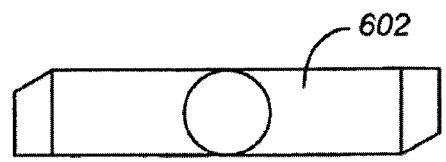
Figure 6D:
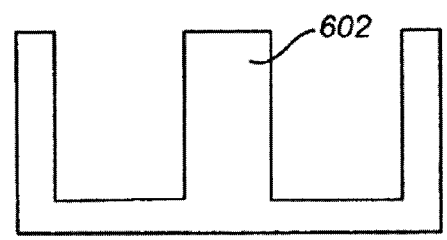
Figure 6B:
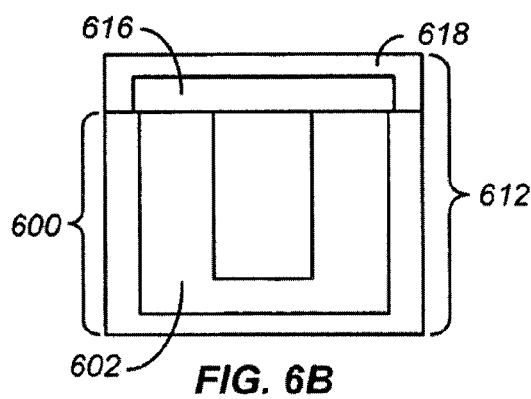
Figure 6E:
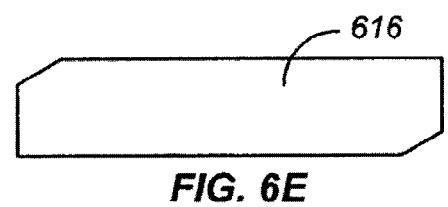
Figure 6F:
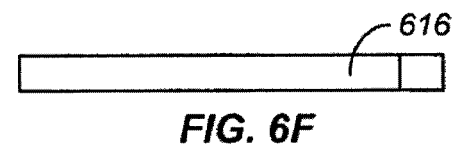

FIG. 6A, shows a top view of PCB 600 with PCB holes 604 receiving core posts 606 of E-core 602. Dashed-lined rectangular areas 608 and 610 depict bottom pad areas. FIG. 6B shows cross section view of package 612 which incorporates PCB 600, and PCB 600 in turn includes core 602 embedded therein with I-bar 616 extending over PCB 600 and contacting posts of core 602. Over-mold 618 encapsulates I-bar 616 and any other components that are attached along the top surface of PCB 600. FIG. 6C shows top view of E-core 602, FIG. 6D shows side view of E-core 602, FIG. 6E shows a top view of I-bar, and FIG. 6F shows a side view of I-bar 616.

Figure 7:
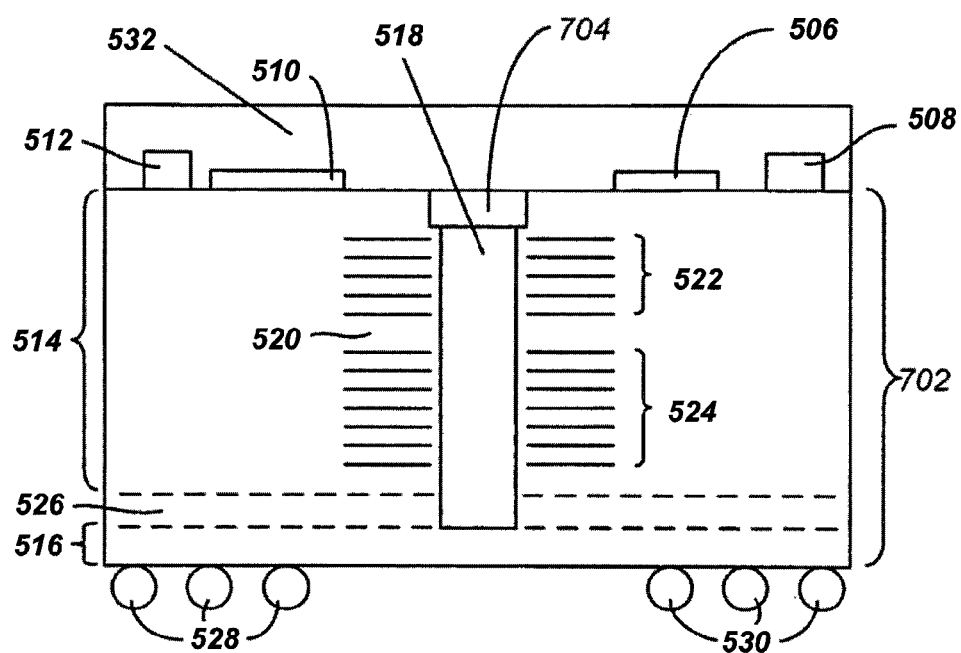
FIG. 7 shows a side view of a package device with an embedded E-core and other components according to still another embodiment of the invention.

In one variation of the invention, one or more cavities are provided along the top surface of the PCB substrate to allow I-bars or other top-side components to be down-set in order to provide a flat surface for bump-chip and other SMD assemblies requiring solder stencil printing. FIG. 7 shows an example where I-bar 704 is down-set in a cavity formed in PCB 702 such that a top surface of I-bar 704 is substantially co-planar with the top surface of PCB 602. Note that for purposes of bump-chip and other SMD assemblies, the top surface of I-bar 704 need not be perfectly coplanar with the PCB top surface, and may instead be slightly recessed relative to the top surface of PCB 602. All other features of the BGA device in FIG. 7 are similar to those in FIG. 5A and thus will not be described.

The various embodiments of the invention described above are particularly suited for power product applications such as DC-DC Converters, Off-Line Converters, and Power Supplies and Magnetically Isolated Gate Drives, but the above techniques may be used in any product or application that would benefit from magnetic components embedded in a PCB substrate-based package. Other such products may be stand alone transformers or inductors. Further, while the various embodiments are described in the context of core configurations with multiple posts, the invention is not limited as such. For example, the same embedding techniques described above can be used to embed a core that has only one vertically extending post (with no plates) in a PCB substrate-based package, with primary and secondary windings extending around the post along the horizontal dimension. As another example, the above embedding techniques can be used to embed a core that has only one horizontally extending post in a PCB substrate-based package, with primary and secondary windings extending around the post along the vertical dimension.

While the above provides a complete description of various embodiments of the invention, many alternatives, modifications, and equivalents are possible. For this and other reasons, the above description should not be taken as limiting the scope of the invention, which is defined by the appended claims.

What is claimed is:

1. A structure comprising:
a printed circuit board (PCB) substrate having an upper part with a top surface stacked on a lower part with a bottom surface;
a magnetic component comprising a laterally extending bottom plate, two or more vertically extending posts, and a laterally extending top plate, wherein the bottom plate is fully within the PCB substrate and the two or more vertically extending posts extend in the upper part of the PCB substrate from the bottom plate to the top surface of the PCB substrate, and the top plate extends over the top surface of the PCB substrate and contacts an end of each of the two or more vertically extending posts; and
a top-side encapsulating layer extending over substantially the entire to surface of the PCB substrate and encapsulating all exposed portions of the magnetic component;
wherein the bottom plate of the magnetic component is stacked on the lower part of the PCB substrate.

2. The structure of claim 1 wherein the magnetic component includes a U-core.

3. The structure of claim 1 wherein the magnetic component includes an E-core.

4. The structure of claim 1 further comprising primary and secondary windings encircling at least one of the two or more vertically extending posts.

5. The structure of claim 1 further comprising at least one set of windings encircling at least one of the two or more vertically extending posts.

6. The structure of claim 1 further comprising primary and secondary windings encircling the bottom plate.

7. The structure of claim 1 further comprising a thermally conductive pre-preg along walls of the each of the two or more vertically extending posts.

8. The structure of claim 1 further comprising a soft pre-preg along walls of the each of the two or more vertically extending posts.

9. The structure of claim 1 further comprising a high flow pre-preg along walls of the each of the two or more vertically extending posts.

10. The structure of claim 1 further comprising one or more IC die electrically attached to the top surface of the PCB substrate.

11. The structure of claim 1 wherein the structure is a semiconductor package which incorporates the PCB substrate.

12. The structure of claim 11 wherein the semiconductor package is one of a ball grid array (BGA) package and a land grid array (LGA) package.

13. The structure of claim 11 wherein the semiconductor package comprises: at least two pad areas along a bottom side of the package where external electrical connection can be made to the semiconductor package.

14. The structure of claim 11 wherein the semiconductor package comprises: one or more IC die electrically coupled to the top surface of the PCB substrate; the top-side encapsulating layer encapsulating all exposed portions of the one or more IC die; and a plurality of conductive pads along the bottom surface of the PCB substrate.

15. The structure of claim 14 wherein the top-side encapsulating layer comprises one of a molding compound and a potting compound.

16. The structure of claim 1 wherein the magnetic component is positioned diagonally on the top surface of the PCB substrate to obtain a higher packing density.

17. The structure of claim 1 wherein the laterally extending top plate, the laterally extending bottom plate and the two or more vertically extending posts form parts of one of an inductor and a transformer.

18. A method for embedding a magnetic component in a PCB substrate for a semiconductor package, the method comprising:
providing an upper part and a lower part of the PCB substrate, the upper part including a plurality of upper PCB layers, and the lower part including at least one lower PCB layer;
forming two or more holes in the plurality of upper PCB layers;
inserting two or more vertically extending posts of the magnetic component in the two or more holes with a bottom plate of the magnetic component remaining exposed beneath a first surface of the plurality of upper PCB layers;
placing the at least one lower PCB layer beneath the first surface of the plurality of upper PCB layers and beneath the bottom plate of the magnetic component wherein the bottom plate of the magnetic component is stacked on the lower part of the PCB substrate such that the bottom plate is fully within the PCB substrate;
placing a magnetic top plate over a second surface of the plurality of upper PCB layers, the second surface opposite the first surface such that the magnetic top plate is in contact with an end of each of the two or more vertically extending posts of the magnetic component; and
placing a top-side encapsulating layer over substantially the entire second surface of the PCB substrate and encapsulating all exposed portions of the magnetic component.

19. The method of claim 18 further comprising:
prior to placing the at least one lower PCB layer over the first surface, placing a layer of thermal pre-preg between the first surface and the bottom plate; and
performing a lamination process to soften the layer of thermal pre-preg so that the layer of thermal pre-preg flows into the two or more holes of the plurality of upper PCB layers along walls of the two or more vertically extending posts of the magnetic component.

20. The method of claim 18 further comprising:
prior to placing the at least one lower PCB layer beneath the first surface, placing beneath the first surface a layer of thermal pre-preg having a slot in a shape of the bottom plate.

21. The method of claim 18 further comprising:
prior to placing the at least one lower PCB layer beneath the first surface, placing beneath the first surface a spacer board having a slot in a shape of the bottom plate.

22. The method of claim 18 wherein placing the top-side encapsulating layer comprises:
placing one or more IC die on the second surface of the plurality of upper PCB layers; and
forming the top-side encapsulating layer over the second surface of the plurality of upper PCB layers to encapsulate the magnetic top plate and the one or more IC die.

23. The method of claim 18 wherein the semiconductor package is one of a ball grid array (BGA) package and a land grid array (LGA) package.

24. The method of claim 18 further comprising:
attaching electronic components to the PCB substrate using one of a chip-and-wire assembly process and a surface-mount assembly process.

25. A method for embedding a magnetic component in a PCB substrate, the method comprising:
providing an upper part and a lower part of a PCB substrate, the upper part including a plurality of upper PCB layers, and the lower part including at least one lower PCB layer;
forming two or more holes in the plurality of upper PCB layers;
inserting two or more vertically extending posts of the magnetic component in the two or more holes with a bottom plate of the magnetic component remaining exposed beneath a first surface of the plurality of upper PCB layers;
placing the at least one lower PCB layer beneath the first surface of the plurality of upper PCB layers and beneath the bottom plate of the magnetic component wherein the bottom plate of the magnetic component is stacked on the lower part of the PCB substrate so that the bottom plate is fully within the upper part and lower part of the PCB substrate;
placing a magnetic top plate over a second surface of the plurality of upper PCB layers, the second surface opposite the first surface; and
placing a top-side encapsulating layer over substantially the entire second surface and encapsulating all exposed portions of the magnetic component.

26. The method of claim 25 wherein placing the magnetic top plate over the second surface of the plurality of upper PCB layers comprises:
placing the magnetic top plate over the second surface of the plurality of upper PCB layers such that the magnetic top plate is in contact with an end of each of the two or more vertically extending posts of the magnetic component.

27. The method of claim 25 wherein placing the magnetic top plate over the second surface of the plurality of upper PCB layers comprises:
placing the magnetic top plate in a cavity formed along the second surface of the plurality of upper PCB layers such that a surface of the magnetic top plate is substantially coplanar with or recessed relative to the second surface of the plurality of upper PCB layers, the magnetic top plate making contact to an end of each of the two or more vertically extending posts inside the cavity.

28. The method of claim 27 further comprising:
after placing the magnetic top plate over the second surface of the plurality of upper PCB layers, dispensing soft coating material around the two or more vertically extending posts.

29. The method of claim 25 further comprising: prior to placing the at least one lower PCB layer beneath the first surface of the plurality of upper PCB layers, placing beneath the first surface a layer of thermal pre-preg having a slot in the shape of the bottom plate.

30. The method of claim 25 further comprising:
prior to placing the at least one lower PCB layer beneath the first surface of the plurality of upper PCB layers, placing beneath the first surface a spacer board having a slot in a shape of the bottom plate.

31. A PCB substrate-based package comprising:
a PCB substrate having an upper part with a top surface stacked on a lower part with a bottom surface, the PCB substrate including a plurality of PCB layers with a plurality of conductive traces extending through each PCB layer of the plurality of PCB layers;
a magnetic post fully embedded within the upper part of the PCB substrate, the magnetic post extending perpendicular to the top and bottom surfaces;
a laterally extending bottom plate fully within the PCB substrate in contact with the magnetic post;
a top plate extending over the top surface of the PCB substrate and in contact with the magnetic post; and
a top-side encapsulating layer extending over substantially the entire to surface of the PCB substrate and encapsulating all exposed portions of the top plate and the magnetic post;
wherein the bottom plate is stacked on the lower part of the PCB substrate.

32. The PCB substrate-based package of claim 31 further comprising primary and second windings encircling the magnetic post, the primary and secondary windings being formed of a select group of the conductive traces and a predetermined number of via for contacting the plurality of conductive traces of adjacent PCB layers of the plurality of PCB layers.

33. The PCB substrate-based package of claim 31 further comprising a set of windings encircling the magnetic post, the set of windings being formed of a select group of the plurality of conductive traces and a predetermined number of via for contacting the plurality of conductive traces of adjacent PCB layers of the plurality of PCB layers.

34. A structure comprising:
a printed circuit board (PCB) substrate having an upper part with a top surface stacked on a lower part with a bottom surface, the PCB substrate further having a cavity in the top surface;
a magnetic component comprising a laterally extending bottom plate, two or more vertically extending posts, and a laterally extending top plate, wherein the laterally extending bottom plate is fully within the PCB substrate and the two or more vertically extending posts extend in the upper part of the PCB substrate from the laterally extending bottom plate toward the cavity, and the laterally extending top plate is disposed in the cavity such that a top surface of the top plate is substantially coplanar with or recessed relative to the top surface of the PCB substrate, the laterally extending top plate making contact to an end of each of the two or more vertically extending posts inside the cavity; and
a top-side encapsulating layer extending over substantially the entire to surface of the PCB substrate and encapsulating all exposed portions of the magnetic component;
wherein the bottom plate of the magnetic component is stacked on the lower part of the PCB substrate.

35. The structure of claim 34 wherein the magnetic component is one of a U-core and an E-core.

36. The structure of claim 34 further comprising a soft coating material encapsulating the top plate and extending along walls of the each of the two or vertically extending more posts.

37. The structure of claim 34 wherein the structure is one of a ball grid array (BGA) package and a land grid array (LGA) package.

38. The structure of claim 34 wherein the laterally extending top plate and the laterally extending bottom plate and the two or more vertically extending posts form parts of one of an inductor and a transformer.

39. The structure of claim 34 wherein the structure comprises:
one or more IC die electrically coupled to the top surface of the PCB substrate;
the top-side encapsulating layer extending over substantially the entire top surface of the PCB substrate and encapsulating the one or more IC die and all exposed portions of the magnetic component including walls of the two or more vertically extending posts; and
a plurality of conductive pads along the bottom surface of the PCB substrate.

40. The structure of claim 39 wherein the top-side encapsulating layer comprises one of a molding compound and a potting compound.

41. A method for embedding a first magnetic plate in a PCB substrate, the method comprising:
providing an upper part and a lower part of a PCB substrate, the upper part including a plurality of upper PCB layers, and the lower part including at least one lower PCB layer;
placing the first magnetic plate beneath a first surface of the plurality of upper PCB layers; and
placing the at least one lower PCB layer beneath the first surface of the plurality of upper PCB layers and beneath the first magnetic plate so that the first magnetic plate is stacked on the lower part of the PCB substrate and the first magnetic plate is fully within the plurality of upper PCB layers and the at least one lower PCB layer;
forming two or more holes in the plurality of upper PCB layers;
inserting magnetic posts of a magnetic component in the two or more holes such that an end of each of the magnetic posts is in contact with the first magnetic plate, the magnetic component having a magnetic top plate that remains at least partially exposed after the magnetic posts are inserted;
placing the magnetic to plate over a second surface of the plurality of upper PCB layers, the second surface opposite the first surface; and
placing a top-side encapsulating layer over substantially the entire second surface and encapsulating all exposed portions of the magnetic component.

42. The method of claim 41 wherein the plurality of upper PCB layers includes a cavity along the second surface of the plurality of upper PCB layers, the cavity receiving the magnetic to plate of the magnetic component during the inserting step, the cavity having sufficient depth such that a surface of the magnetic to plate of the magnetic component is substantially coplanar with or recessed relative to the second surface of the plurality of upper PCB layers.

43. The method of claim 41 further comprising:
after inserting the magnetic posts of the magnetic component in the two or more holes, dispensing soft coating material around the magnetic posts.

44. The method of claim 41 further comprising:
prior to placing the at least one lower PCB layer beneath the first surface of the plurality of upper PCB layers, placing beneath the first surface a layer of thermal prepreg having a slot in a shape of the first magnetic plate.

45. The method of claim 41 further comprising:
prior to placing the at least one lower PCB layer beneath the first surface of the plurality of upper PCB layers, placing beneath the first surface a spacer board having a slot in a shape of the first magnetic plate.

* * * * *

UNITED STATES PATENT AND TRADEMARK OFFICE
CERTIFICATE OF CORRECTION

| | | |
|---|---|---|
| PATENT NO. | : 8,094,458 B2 | Page 1 of 1 |
| APPLICATION NO. | : 12/383468 | |
| DATED | : January 10, 2012 | |
| INVENTOR(S) | : Courtney R. Furnival | |

It is certified that error appears in the above-identified patent and that said Letters Patent is hereby corrected as shown below:

In the claims:

Column 10, line 32 "the entire to surface" should read --the entire top surface--.

Column 13, line 17 "the enrite to surface" should read --the entire top surface--.

Column 13, line 61 "each of the two or vertically extending more" should read --each of the two or more vertically extending--.

Column 14, lines 49-50 "the magnetic to plate" should read --the magnetic top plate--.

Column 14, line 52 "the magnetic to plate" should read --the magnetic top plate--.

Signed and Sealed this
Sixth Day of March, 2012

David J. Kappos
*Director of the United States Patent and Trademark Office*